US011011452B2

(12) United States Patent
Qu et al.

(10) Patent No.: US 11,011,452 B2
(45) Date of Patent: May 18, 2021

(54) HEAT SPREADERS FOR SEMICONDUCTOR DEVICES, AND ASSOCIATED SYSTEMS AND METHODS

(71) Applicant: Micron Technology, Inc., Boise, ID (US)

(72) Inventors: Xiaopeng Qu, Boise, ID (US); Amy R. Griffin, Boise, ID (US); Hyunsuk Chun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/205,151

(22) Filed: Nov. 29, 2018

(65) Prior Publication Data

US 2020/0176353 A1 Jun. 4, 2020

(51) Int. Cl.
*H01L 23/433* (2006.01)
*H01L 23/367* (2006.01)
*H01L 23/31* (2006.01)

(52) U.S. Cl.
CPC ...... *H01L 23/4334* (2013.01); *H01L 23/3114* (2013.01); *H01L 23/3675* (2013.01)

(58) Field of Classification Search
CPC ............. H01L 23/3672; H01L 23/4093; H01L 23/4275; H01L 2224/16225; H01L 2224/73253

See application file for complete search history.

(56) References Cited

U.S. PATENT DOCUMENTS

| | | | |
|---|---|---|---|
| 7,023,701 B2 | 4/2006 | Stocken et al. | |
| 7,289,331 B2* | 10/2007 | Foster, Sr. | G06F 1/184 165/80.3 |
| 7,593,229 B2 | 9/2009 | Shuy | |
| 7,969,736 B1 | 6/2011 | Iyengar et al. | |
| 8,059,406 B1 | 11/2011 | Meyer et al. | |
| 9,089,076 B2 | 7/2015 | Cox et al. | |
| 9,754,856 B2* | 9/2017 | Caroff | H01L 23/38 |
| 2004/0218367 A1 | 11/2004 | Lin et al. | |
| 2005/0201063 A1 | 9/2005 | Lee et al. | |

(Continued)

OTHER PUBLICATIONS

U.S. Appl. No. 16/118,889—Unpublished U.S. Patent Application by Xiaopeng Qu et al., filed Aug. 31, 2018, titled "Heat Spreaders for Multiple Semiconductor Device Modules", 29 pages.

*Primary Examiner* — Dung A. Le
(74) *Attorney, Agent, or Firm* — Perkins Coie LLP

(57) ABSTRACT

A memory system having heat spreaders with different arrangements of projections are provided. In some embodiments, the memory system comprises a substrate, a first semiconductor device attached to a first side of the substrate, a second semiconductor device attached to a second side of the substrate, a first heat spreader attached to the first semiconductor device, and a second heat spreader attached to the second semiconductor device. The first heat spreader has a plurality of first projections facing a first direction and positioned in a first arrangement, and the second heat spreader has a plurality of second projections facing a second direction and positioned in a second arrangement different than the first arrangement. In some embodiments, the first projections are aligned with a majority of the second projections in a first direction and are offset with a majority of the second projections in a second direction.

23 Claims, 11 Drawing Sheets

(56) References Cited

U.S. PATENT DOCUMENTS

| | | |
|---|---|---|
| 2006/0278371 A1 | 12/2006 | Karidis et al. |
| 2007/0070607 A1 | 3/2007 | Goodwin |
| 2009/0129026 A1* | 5/2009 | Baek .................. H01L 23/3672 361/710 |
| 2009/0219687 A1 | 9/2009 | Lin |
| 2009/0310295 A1 | 12/2009 | Chou et al. |
| 2010/0188817 A1 | 7/2010 | Chou et al. |
| 2012/0162919 A1 | 6/2012 | Lin |
| 2013/0194745 A1 | 8/2013 | Meijer et al. |
| 2013/0306292 A1 | 11/2013 | Iyengar et al. |

* cited by examiner

HEAT SPREADERS FOR SEMICONDUCTOR DEVICES, AND ASSOCIATED SYSTEMS AND METHODS

CROSS-REFERENCE TO RELATED APPLICATION(S)

U.S. patent application Ser. No. 16/118,889, filed on Aug. 31, 2018, is incorporated herein by reference in its entirety.

TECHNICAL FIELD

The present disclosure generally relates to semiconductor devices, and more particularly relates to heat spreaders for semiconductor device modules.

BACKGROUND

Memory packages or modules typically include multiple memory devices mounted on a substrate. Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others.

Improving memory packages, generally, may include increasing memory cell density, increasing read/write speeds or otherwise reducing operational latency, increasing reliability, increasing data retention, reducing power consumption, reducing manufacturing costs, and reducing the size or footprint of the memory packages and/or components of the memory devices, among other metrics. A challenge associated with improving memory packages is that improvements often result in increased heat generation—e.g., as a result of increasing memory device density, increasing the speed or processing ability of the memory devices, etc. Without sufficient cooling, the additional heating can cause the memory devices to reach temperatures above their maximum operating temperatures ($T_{max}$).

DETAILED DESCRIPTION

Specific details of several embodiments of memory modules having heat spreaders, and associated systems and methods, are described below with reference to the appended Figures. In several of the embodiments, a memory system can include multiple memory modules, such as dual in-line memory modules (DIMMs), each having a substrate, and one or more memory device(s) on front and back sides of the substrate. One or more heat spreaders can be attached to the memory device(s) to aid in the removal of heat from the memory device(s). In some embodiments, the heat spreaders can include a first heat spreader attached to the memory device(s) on a first side of the substrate and a second heat spreader attached to the memory device(s) on a second side of the substrate. The first heat spreader can have first projections arranged in a first arrangement and the second heat spreader can have second projections arranged in a second arrangement different than the first arrangement. As explained in further detail below, the first projections can be generally aligned with the second projections in a first direction (e.g., a vertical direction) and be generally offset (e.g., not aligned) with the second projections in a second direction (e.g., a horizontal direction). In some embodiments, substrates may be positioned next to one another on a computing device, with a first substrate having the first heat spreader with the first projections attached thereto, and the second substrate having the second heat spreader with the second projections attached thereto. In such a position, the first projections can face the second projections such that the first projections are generally aligned with a majority of the second projections in a first direction and generally offset with a majority of the second projections in a second direction.

Figure 1:
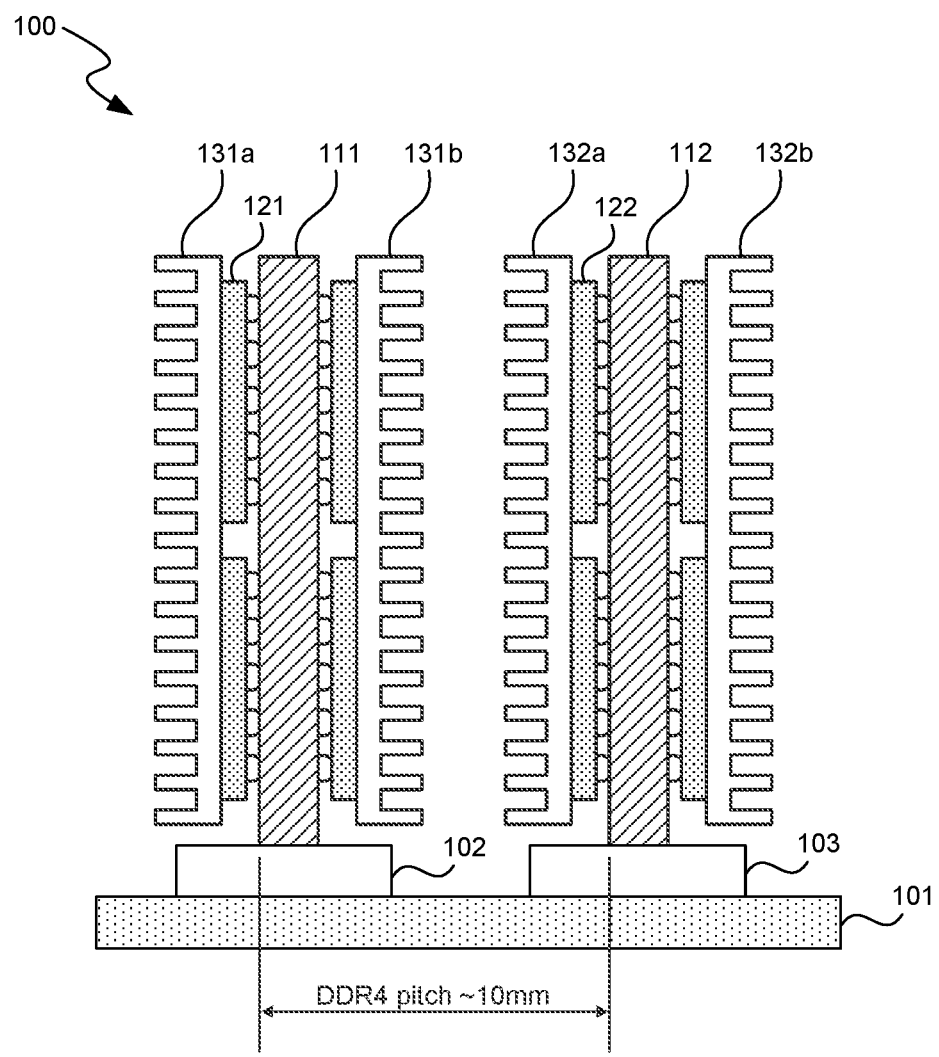
FIGS. 1 and 2 illustrate memory systems with multiple memory modules.

FIG. 1 illustrates a memory system including multiple memory modules. Memory system 100 may include a computing device 101 (e.g., a motherboard) to which memory modules 111 and 112 are connected (e.g., by memory connectors 102 and 103). Memory modules 111 and 112 can each include multiple semiconductor memory devices on either side thereof (e.g., memory dies), such as memory devices 121 and 122. In operation, memory devices 121 and 122 can generate waste heat, which can negatively impact the operation of memory system 100 if left unaddressed. Accordingly, memory system 100 can include heat spreaders, such as heat spreaders 131a and 131b attached to opposing sides of memory module 111, and heat spreaders 132a and 132b attached to opposing sides of memory module 112.

In a DDR4 memory system, memory modules 111 and 112 may be spaced apart by a predetermined pitch (e.g., of about 10 mm). Accordingly, the space available between adjacent memory modules 111 and 112 for the heat spreaders 131b and 132a is about equal to this pitch minus the thickness of one of the memory modules (e.g., with a distance between outer surfaces of opposing memory devices of a memory module being about 2.8 mm, space available for the two heat spreaders 131b and 132a to occupy is about 7.2 mm). Accordingly, if each of the heat spreaders 132a and 132b is about 2 mm thick, there remains an air gap of about 3.2 mm between the adjacent heat spreaders 132a and 132b, which is generally sufficient for airflow to help dissipate the heat conducted away from the memory devices 121 and 122.

Figure 2:
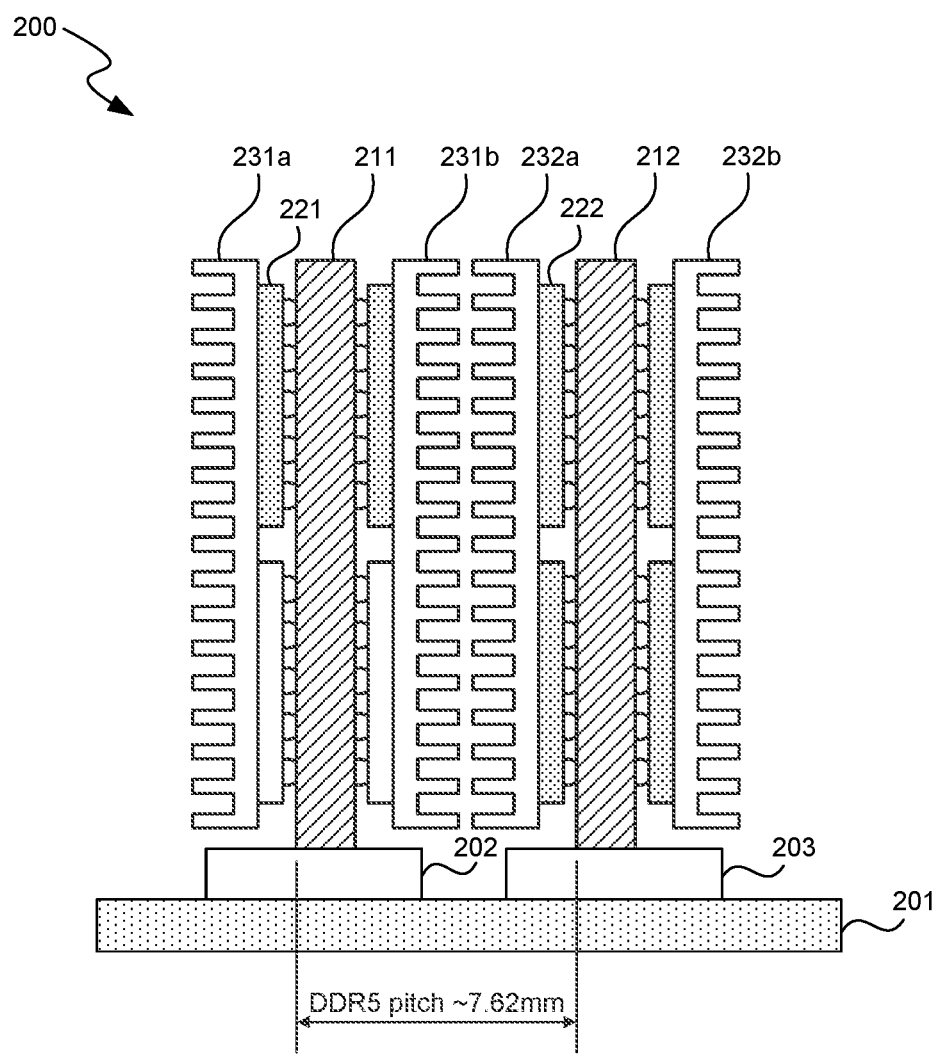

Turning to FIG. 2, a similar memory system 200 is illustrated, in which the pitch between adjacent memory modules is reduced. Memory system 200 may be a DDR5 memory system, in which the pitch between adjacent memory modules is about 7.62 mm. As can be seen with reference to FIG. 2, memory system 200 includes a computing device 201 (e.g., a motherboard) to which memory modules 211 and 212 are connected (e.g., by memory connectors 202 and 203). Memory modules 211 and 212 can each include multiple semiconductor memory devices on either side thereof (e.g., memory dies), such as memory devices 221 and 222. Memory system 200 can further include heat spreaders, such as heat spreaders 231a and 231b attached to opposing sides of memory module 211, and heat spreaders 232a and 232b attached to opposing sides of memory module 212.

Because of the reduction of pitch in a DDR5 system when compared to a DDR4 system, the space available between adjacent memory modules 211 and 212 for the heat spreaders 231b and 232a is about equal to the reduced pitch of 7.62 mm minus the thickness of one of the memory modules (e.g., with a distance between outer surfaces of opposing memory devices of a memory module being about 2.8 mm, space available for the two heat spreaders 231b and 232a to occupy is about 4.82 mm). Accordingly, if each of the heat spreaders 232a and 232b is about 2 mm thick, there remains an air gap of about 0.82 mm between the adjacent heat spreaders 232a and 232b, which is generally insufficient for airflow to help dissipate the heat conducted away from the memory devices 221 and 222.

Figure 3A:
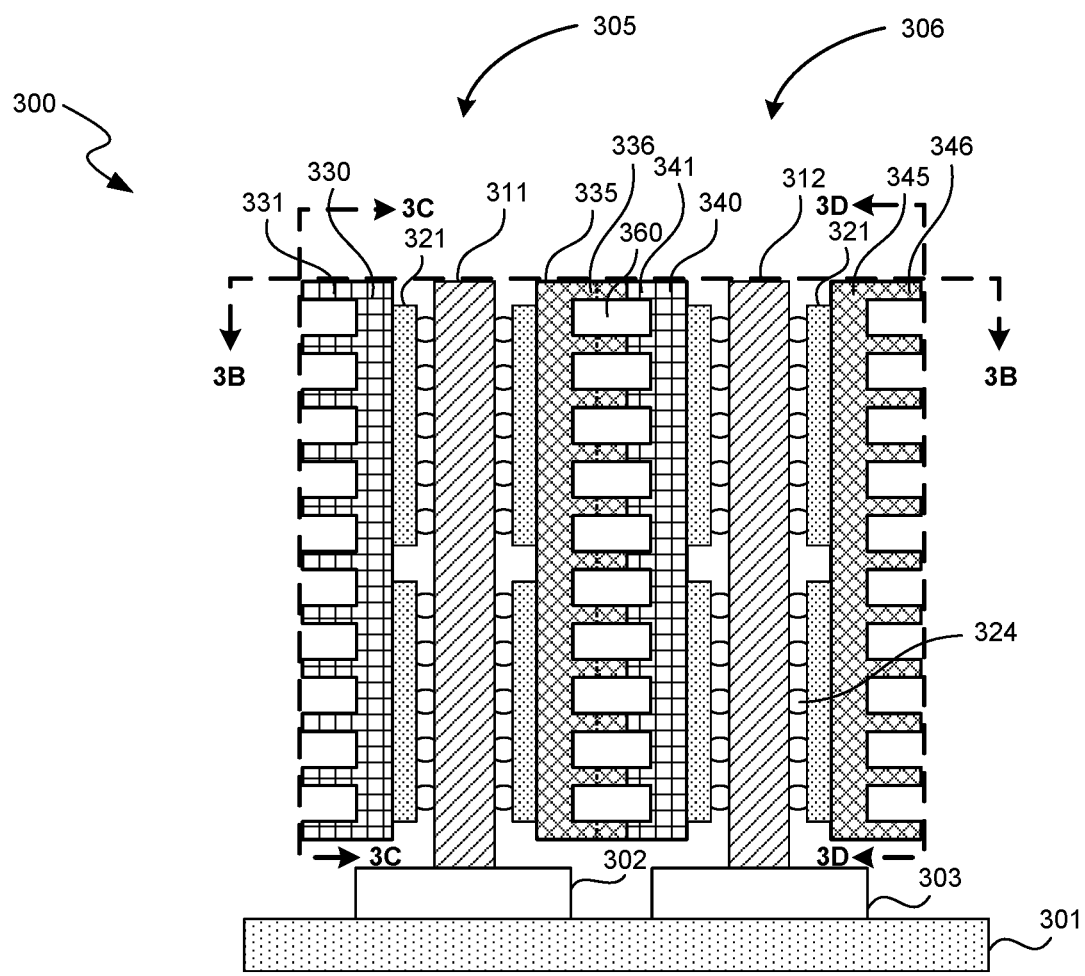
FIG. 3A illustrates a front view of a memory system including heat spreaders in accordance with embodiments of the present disclosure.
Figure 3B:
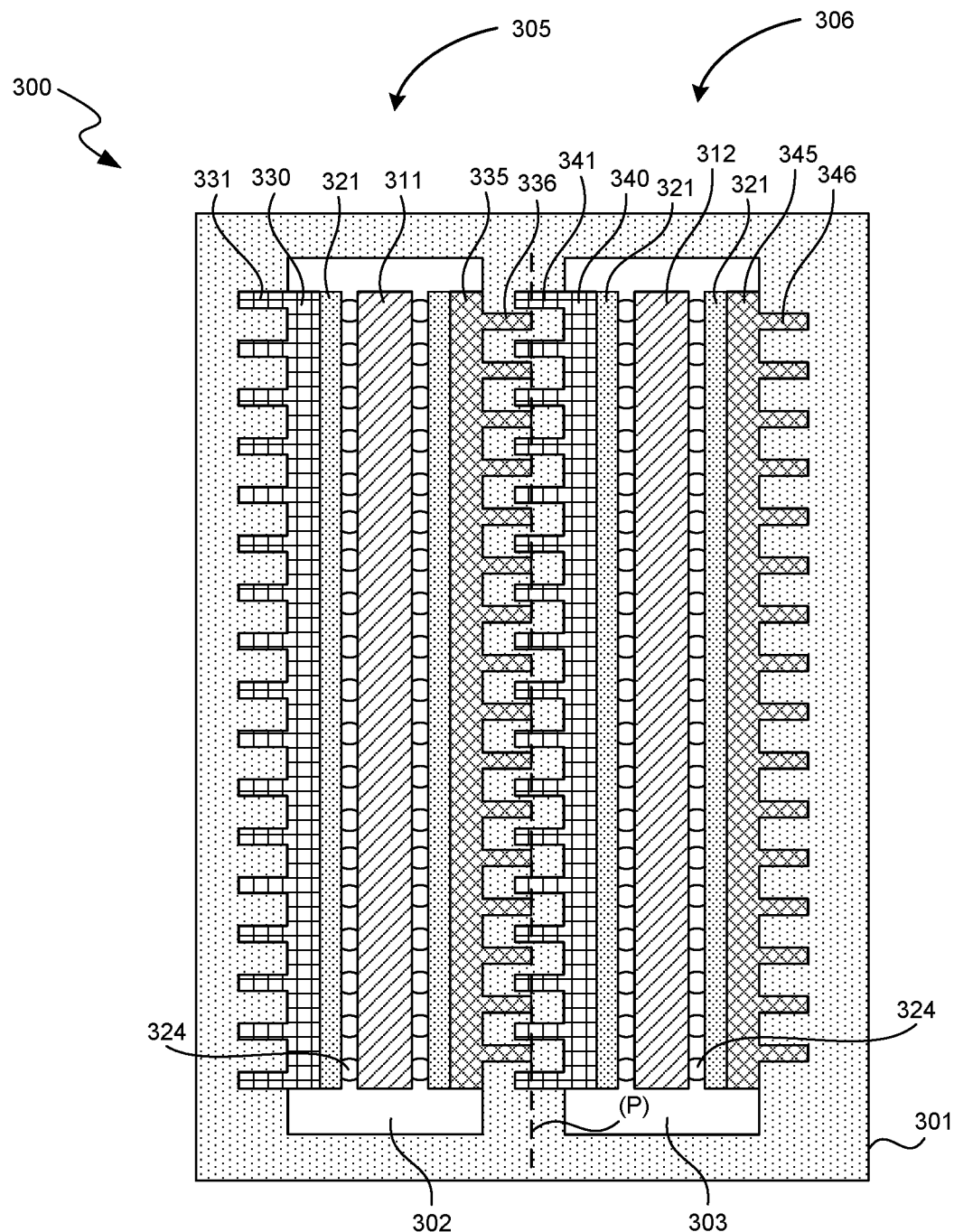
FIG. 3B illustrates a top view of the memory system shown in FIG. 3A.
Figure 3C:
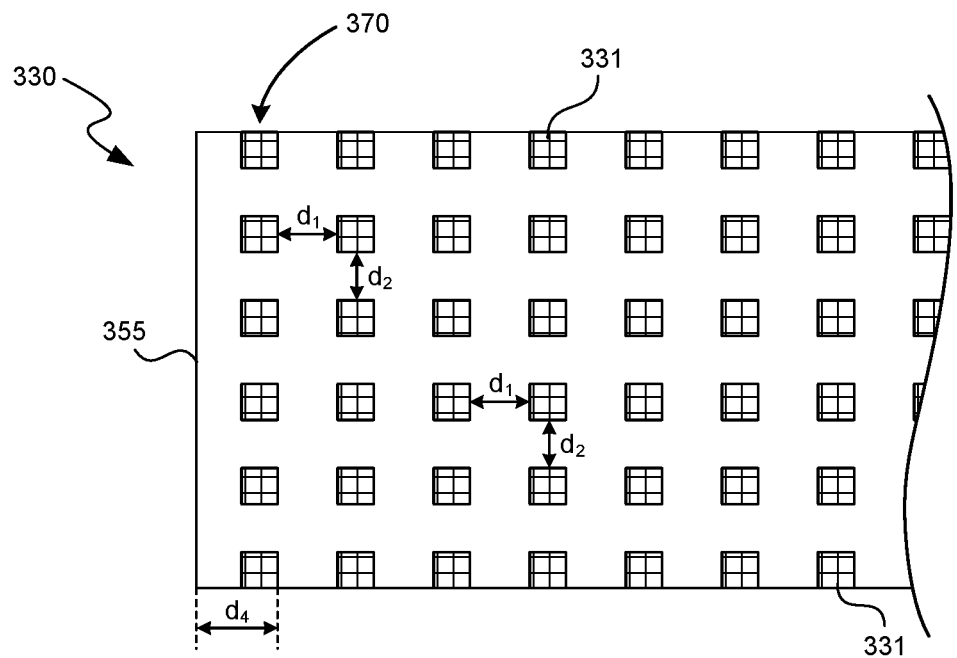
FIGS. 3C and 3D illustrate side views of the memory system shown in FIG. 3A.
Figure 3D:
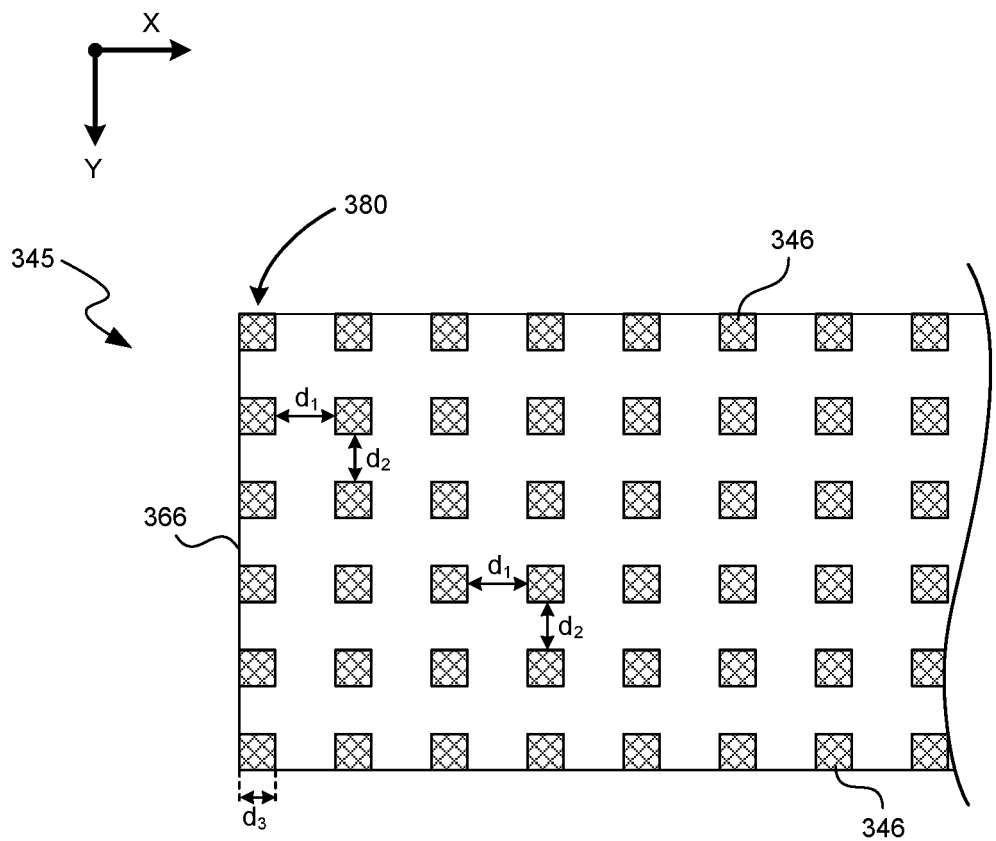

To address the foregoing problems, embodiments described in the present disclosure can provide heat spreaders for semiconductor device modules, to provide improved performance in memory systems with reduced spacing between adjacent memory modules. For example, FIG. 3A illustrates a front view of a memory system 300 including heat spreaders, FIG. 3B illustrates a top view of the memory system 300 shown in FIG. 3A, and FIGS. 3C and 3D illustrate side views of the memory system 300 shown in FIG. 3A. Referring to FIGS. 3A and 3B together, the memory system 300 includes a computing device 301, a first memory connector 302, a second memory connector 303, a first memory module 305 connected to the computing device 301 via the first memory connector 302, and a second memory module 306 connected to the computing device 301 via the second memory connector 302. As shown in the illustrated embodiment, the first memory module 305 and the second memory module 306 are identical, and are included in FIG. 3A to illustrate the interface between memory modules when positioned next to one another on the computing device 301. Accordingly, details regarding the first memory module 305 can generally be applied to the second memory module 306, unless indicated otherwise. The first memory module 305 can include a substrate 311 and one or more semiconductor memory devices 321 attached to opposing sides of the substrate 311 via electrical connectors 324 (e.g., solder balls). The second memory module 306 similarly can include a substrate 312 and one or more semiconductor memory devices 321 attached to opposing sides of the substrate 312 via electrical connectors 324.

The memory system 300 can further include heat spreaders, such as heat spreaders 330 and 335 attached to opposing sides of the first memory module 305, and heat spreaders 340 and 345 attached to opposing sides of the second memory module 306. In some embodiments, the heat spreaders 330, 335, 340, 345 can be attached to the semiconductor memory devices 321 via a thermally conductive adhesive. The heat spreaders 330, 335, 340, 345 can each include a first side having a generally planar surface attached to the one or more corresponding semiconductor devices 321, and a second side having a plurality of projections, such as projections 331 of heat spreader 330, projections 336 of heat spreader 335, projections 341 of heat spreader 340, and projections 346 of heat spreader 345. The heat spreaders 330, 335, 340, 345 can include a thermally conductive body formed from a metal or another thermally conductive material (e.g., copper, aluminum, alloys thereof, graphite, thermally-conductive polymers, etc.). As shown in the illustrated embodiment, the projections are part of a continuous outermost surface of the heat spreader. Each of the projections 331, 336, 341, 346 resembles a rectangular shape, and includes sidewalls and an outermost edge perpendicular to the sidewalls. As described in detail below (e.g., with reference to FIGS. 7A-7C), the projections can assume shapes other than rectangles, including those that increase the surface area of the outermost surface of the heat spreader.

Figure 4A:
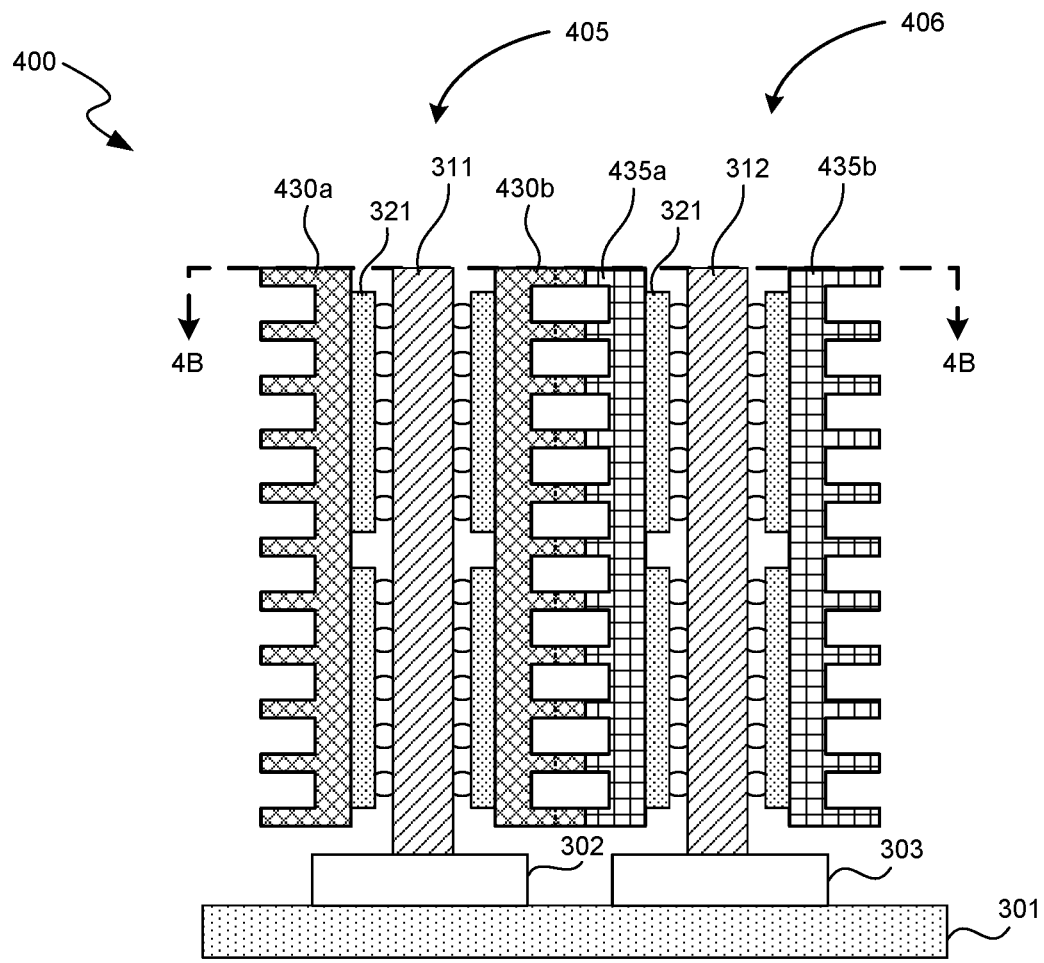
FIG. 4A illustrates a front view of a memory system including heat spreaders in accordance with embodiments of the present disclosure.
Figure 4B:
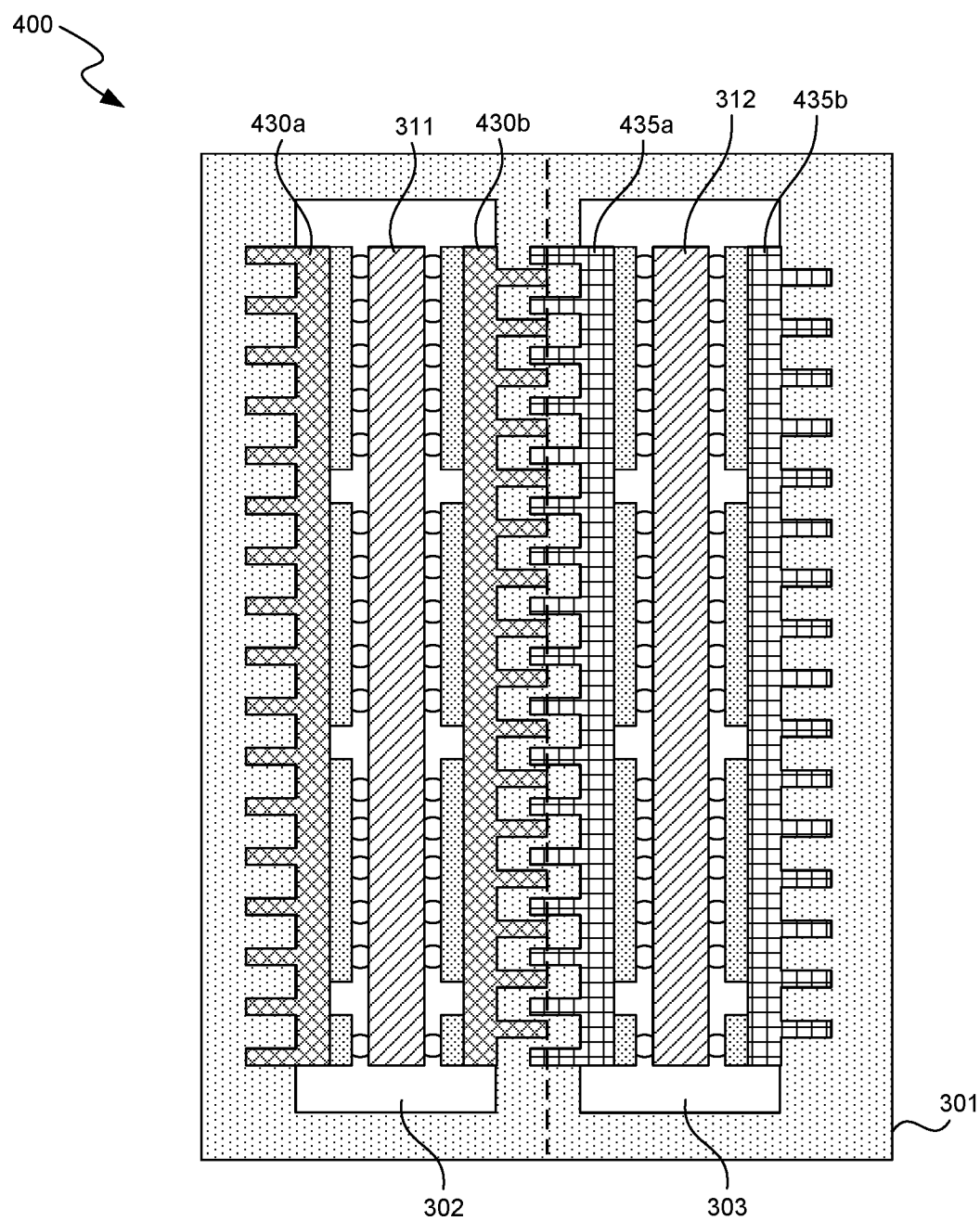
FIG. 4B illustrates a top view of the memory system shown in FIG. 4A.

The projections of the heat spreaders attached to opposing sides of a single memory module can include different arrangements (e.g., as shown in FIGS. 3A and 3B) or the same arrangements (e.g., as shown in FIGS. 4A and 4B). As shown in the illustrated embodiments of FIGS. 3A and 3B, the heat spreaders 330 and 340 have a first arrangement of projections, and the heat spreaders 335 and 345 have a second arrangement of projections different than the first arrangement. The projections of the first and second arrangements can be generally aligned or offset with one another in one or more directions. For example, as shown in the illustrated embodiment of FIG. 3A, the projections 336 of the heat spreader 335 are generally aligned with the projections 341 of the heat spreader 340 in a vertical direction. The alignment of the projections 336, 341 can effectively form a plurality of air channels 360 configured to permit airflow from one end of the heat spreaders 335, 340 to an opposing end thereof. The permitted airflow through the air channels 360 can facilitate the dissipation of heat from the memory devices attached thereto. As explained in further detail below (e.g., with reference to FIG. 6), the plurality of air channels 360 can be configured to receive a forced air flow from a fan disposed at one of the ends (e.g., the top, bottom and/or sides) of the heat spreaders 335, 340.

As shown in the illustrated embodiment of FIG. 3B, the projections 336 of the heat spreader 335 are offset (i.e., not generally aligned) with the projections 341 of the heat spreader 340 in a horizontal direction. As a result of the different first and second arrangements, the projections of heat spreaders having the first arrangement can be interleaved with the projections of heat spreaders having the second arrangement when the first and second memory modules 305, 306 are positioned next to one another. In such a position, as shown in the illustrated embodiment, an outermost surface of the projections 341 (i.e., the outermost surface facing the first memory module 305) is configured to extend beyond a plane (P) defined by an outermost surface of the projections 336.

FIG. 3C illustrates a side view of the memory system 300, showing the first arrangement of projections 331 of the heat spreader 330, and FIG. 3D illustrates an opposing side view of the memory system 300, showing the second arrangement of projections 346 of the heat spreader 345. As shown in the illustrated embodiments of FIGS. 3C and 3D, individual projections 331, 346 can be spaced apart from neighboring projections by a first distance ($d_1$) in the horizontal direction (e.g., the x-direction) and by a second distance ($d_2$) in the vertical direction (e.g., the y-direction). In some embodiments, such as the embodiment shown in FIGS. 3C and 3D, the spacing between individual projections of the first arrangement in the horizontal and/or vertical direction is the same as that of individual projections of the second arrangement. In other embodiments, however, the spacings may differ.

As stated above with reference to FIG. 3B, the projections of the first arrangements may be aligned with and/or offset with projections of the second arrangement in one or more directions. As shown in the illustrated embodiment, for example, the projections 331 of the first arrangement are generally aligned with the projections 346 of the second arrangement in the vertical direction, but are offset in the horizontal direction. As such, the horizontal spacing between an edge and an outermost row of projections for the first arrangement will differ relative to the horizontal spacing between an edge and an outermost row of projections for the second arrangement. As shown in the illustrated embodiments, for example, an outermost row of projections 370 of the first arrangement is spaced apart from an edge 355 of the heat spreader 330 by a third distance ($d_3$), and an outermost row of projections 380 of the first arrangement is spaced apart from an edge 356 of the heat spreader 345 by a fourth distance ($d_4$) different (e.g., smaller) than the third distance.

Embodiments of the present technology have multiple advantages over conventional or traditional technologies, one of which is the ability to use heat spreaders with memory modules that have a limited space next to adjacent memory modules. For example, as noted above, many memory systems, such as the DDR5 memory systems, have less than 5 mm between adjacent modules. As a result, a conventional heat spreader used would have to be limited in size, thereby limiting the surface area of the heat spreader and the amount of heat that can be dissipated therefrom. Embodiments of the present technology directly address this challenge because adjacent memory modules can have heat spreaders with different arrangements of projections, thereby allowing individual projections of one heat spreader to be interleaved (e.g., in a vertical or horizontal direction) between projections of the heat spreader adjacent thereto. Stated differently, by having different arrangements of projections, the individual projections can extend beyond an outermost surface or plane of the adjacent individual projections. As a result, projections of heat spreaders of the present technology can be larger and the exposed surface area increased relative to conventional heat spreaders, thereby increasing the thermal capacity of the heat spreaders and their ability to dissipate heat.

FIG. 4A illustrates a front view of a memory system 400 including heat spreaders in accordance with embodiments of the present disclosure, and FIG. 4B illustrates a top view of the memory system 400. The embodiment illustrated in FIGS. 4A and 4B is similar to the embodiments illustrated in FIGS. 3A-3D, but differs in that the heat spreaders attached to opposing sides of the memory modules in FIGS. 4A and 4B have the same arrangement of projections.

As shown in the illustrated embodiment, the memory system 400 includes the computing device 301, the first memory connector 302, and the second memory connector 303, as well as a first memory module 405 connected to the computing device 301 via the first memory connector 302, and a second memory module 406 connected to the computing device 301 via the second memory connector 302. The first memory module 405 includes the substrate 311 and semiconductor memory devices 321 attached to opposing sides of the substrate 311, and the second memory module 406 includes the substrate 312 and semiconductor memory devices 321 attached to opposing sides of the substrate 312. Furthermore, the first memory module 405 includes heat spreaders 430a, 430b (collectively referred to as "heat spreaders 430") having the first arrangement of projections, and the second memory module 406 includes heat spreaders 435a, 435b (collectively referred to as "heat spreaders 435") having the second arrangement of projections, as described above with reference to FIGS. 3A-3D. As shown in the illustrated embodiments of FIGS. 4A and 4B, the interface between heat spreader 430b and 435a is identical to that described above with reference to FIGS. 3A and 3B. For example, as shown in FIG. 4A, the projections 431 of the heat spreader 430b are generally aligned with the projections 436 of the heat spreader 435b in a vertical direction, and as shown in FIG. 4B, the projections 431 of the heat spreader 430b are offset (i.e., not aligned) with the projections 436 of the heat spreader 435b in a horizontal direction.

Figure 5:
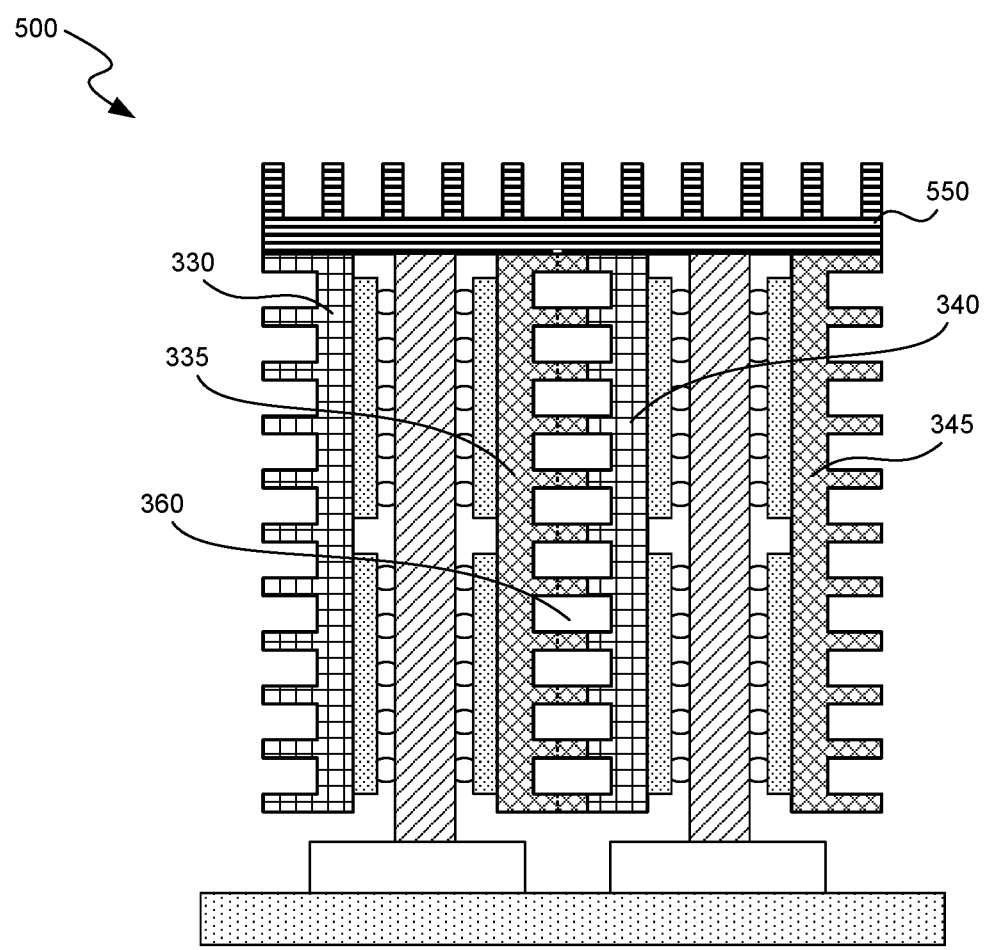
FIG. 5 illustrates a front view of a memory system including heat spreaders in accordance with embodiments of the present disclosure.

In accordance with another embodiment of the present disclosure, providing a memory system with multiple heat spreaders that have co-planar top surfaces either at or above a top surface of the memory modules to which they are attached can permit the attachment of an upper heat spreader to further increase the surface area used for heat exchange between the memory system and the surrounding atmosphere. For example, FIG. 5 illustrates a memory system 500 that is similar to the memory system 300 shown in FIG. 3, but further includes an upper heat spreader 550 that includes a thermally conductive body and can further optionally include a plurality of projections or other structures configured to increase a surface area thereof. By passing the forced air flow through the plurality of air channels 360 (FIG. 3A), and/or other surface-area-increasing structures of the heat spreaders 330, 335, 340, 345, 550, heat from the memory devices of the memory system 500 can be dissipated in an effective manner.

Figure 6:
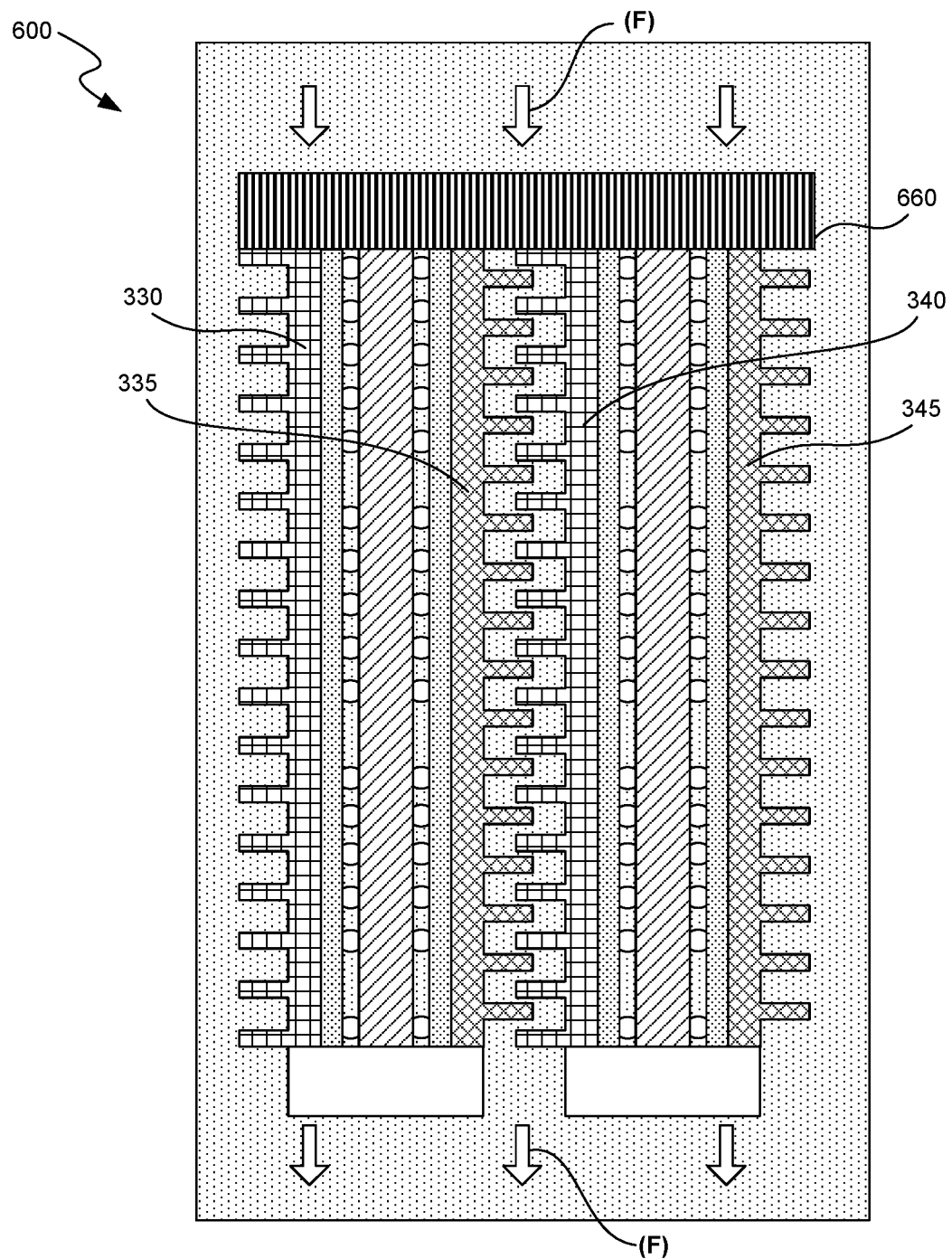
FIG. 6 illustrates a top view of a memory system including heat spreaders and a fan unit in accordance with embodiments of the present disclosure.

FIG. 6 illustrates a top view of a memory system 600 including multiple heat spreaders and a fan unit in accordance with embodiments of the present disclosure. Memory system 600 is similar to the memory system 300 described with reference to FIGS. 3A-3D, but further includes a fan unit 660. The fan unit 660 is configured to provide a forced air flow (F) over the memory system 600. As stated above, the interface of the heat spreaders between memory modules 305, 306 can form a plurality of air channels 360 (FIG. 3A), and these air channels can be configured to receive the forced air flow from the fan unit 660. As such, heat from the memory devices of the memory system 600 can be dissipated in an effective manner using the fan unit 660. As shown in the illustrated embodiment, the fan unit 660 is disposed on a side surface of the heat spreaders 330, 335, 340, 345 and memory modules 305, 306, and is configured to provide forced air flow from one side of the memory system 600 to an opposing side thereof. In other embodiments, the fan unit may be disposed on another portion (e.g., a top portion) of the memory system 600, depending on what direction the air channels are facing if they exist. Furthermore, while the fan unit 660 is shown in FIG. 6 to be over two memory modules, in some embodiments the fan unit 660 may be sized to cover more (e.g., three) or less (e.g., one) memory modules.

Figure 7C:
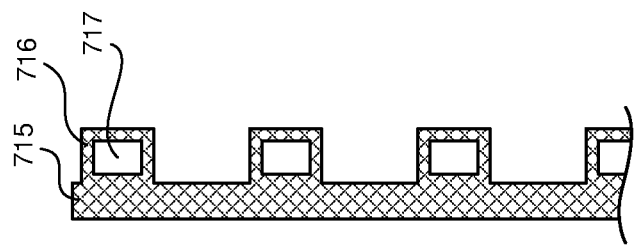
FIGS. 7A-7C illustrate heat spreaders in accordance with various embodiments of the present disclosure.
Figure 7B:
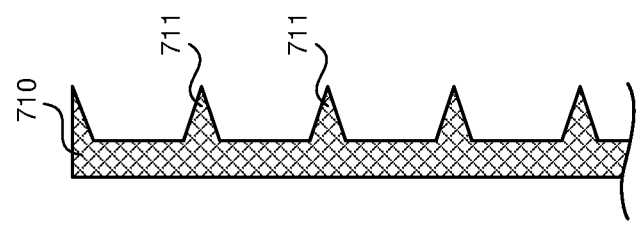
Figure 7A:
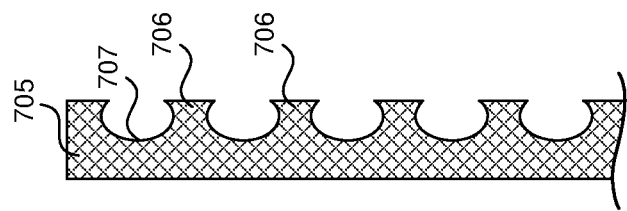

Although in the foregoing example embodiments the projections of heat spreaders has been illustrated to have a generally rectangular shape, in other embodiments of the present disclosure, projections having other configurations can be provided. For example, FIGS. 7A-7C illustrate a memory system including heat spreaders for multiple semiconductor device modules that have a variety of projection shapes. FIG. 7A includes a heat spreader 705 having projections 706 with rounded concave edges 707, FIG. 7B includes a heat spreader 710 having projections 711 with a triangular shape, and FIG. 7C includes a heat spreader 715 having rectangular projections 716 with air channels 717.

Figure 8:
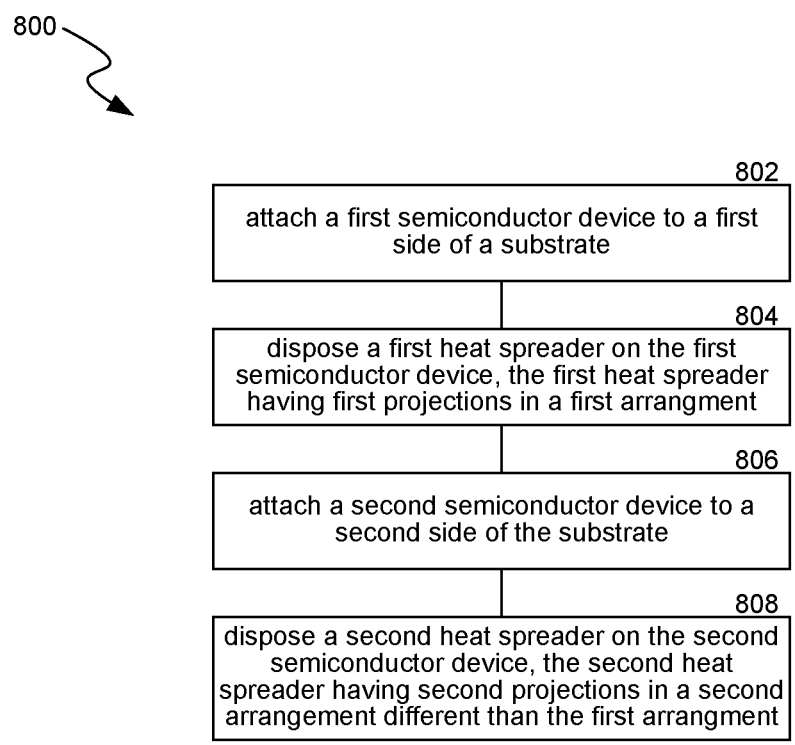
FIG. 8 is a flow chart illustrating a method of configuring a memory system in accordance with embodiments of the present disclosure.

FIG. 8 is a flow chart illustrating a method 800 of manufacturing a memory module in accordance with an embodiment of the present disclosure. The method 800 includes attaching a first semiconductor device to a first side of a substrate (process portion 802). In some embodiments, the substrate may be part of a memory module, as described above, and be attached to a memory connector that is attached to a computing device. The method 800 can further include disposing a first heat spreader on the first semiconductor device, with the first heat spreader having a plurality of first projections arranged in a first arrangement (process portion 804). The method 800 can further include attaching a second semiconductor device to a second side of the substrate (process portion 806), and disposing a second heat spreader on the second semiconductor device, with the second heat spreader having a plurality of second projections arranged in a second arrangement different than the first arrangement (process portion 808). The first and second arrangements can correspond to the first and second arrangements described above with reference to FIGS. 3A-3D. For example, in some embodiments, the first projections in the first arrangement can be generally aligned with the second projections in the second arrangement in a first direction (e.g., a vertical direction), and be generally offset with the second projections in a second direction (e.g., a horizontal direction).

Numerous specific details are discussed to provide a thorough and enabling description of embodiments of the present technology. A person skilled in the art, however, will understand that the technology may have additional embodiments and that the technology may be practiced without several of the details of the embodiments described below with reference to the appended Figures. For example, while the projections of certain heat spreaders were shown to align with other projections in a vertical direction and be offset from other projections in a horizontal direction, in some embodiments, the opposite may be true (i.e., projections can be aligned in a horizontal direction and offset in a vertical direction). In other instances, well-known structures or operations often associated with memory devices are not shown, or are not described in detail, to avoid obscuring other aspects of the technology. In general, it should be understood that various other devices and systems in addition to those specific embodiments disclosed herein may be within the scope of the present technology. For example, in the illustrated embodiments, the memory devices and systems are primarily described in the context of DIMMs compatible with DRAM and flash (e.g., NAND and/or NOR) storage media. Memory devices and systems configured in accordance with other embodiments of the present technology, however, can include memory modules compatible with other types of storage media, including PCM, RRAM, MRAM, read only memory (ROM), erasable programmable ROM (EPROM), electrically erasable programmable ROM (EEROM), ferroelectric, magnetoresistive, and other storage media, including static random-access memory (SRAM). Additionally, at least some of the heat spreaders described herein may be useful in semiconductor packages other than memory packages.

As used herein, the terms "vertical," "horizontal," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

From the foregoing, it will be appreciated that specific embodiments of the technology have been described herein for purposes of illustration, but that various modifications may be made without deviating from the disclosure. For example, while a certain number of projections of heat spreaders are shown in FIGS. 3A-8, this number can vary according to the needs of the particular application. Accordingly, the invention is not limited except as by the appended claims. Furthermore, certain aspects of the new technology described in the context of particular embodiments may also be combined or eliminated in other embodiments. For example, the fan unit 660 shown in FIG. 6 can be incorporated into the embodiment shown in FIGS. 4A-5, and the third heat spreader 550 shown in FIG. 5 can be incorporated into the embodiment shown in FIGS. 4A and 4B. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory system comprising:
a first memory module including one or more first semiconductor device(s), the first memory module configured to be attached to a first connector of a computing device;
a second memory module including one or more second semiconductor device(s), the second memory module configured to be attached to a second connector of the computing device;
a first heat spreader configured to be attached to the first semiconductor device(s) and including a plurality of first projections projecting away from the first memory module, wherein neighboring first projections are spaced apart from one another; and
a second heat spreader configured to be attached to the second semiconductor device(s) and including a plurality of second projections projecting away from the second memory module, wherein neighboring second projections are spaced apart from one another,
wherein,
when the first memory module is attached to the first connector and the second memory module is attached to the second connector, a majority of the second projections are positioned between neighboring first projections, and
each projection in the plurality of first projections and/or the plurality of second projections has a side-view shape other than a rectangle or the side-view shape includes an air channel therein.

2. The memory system of claim 1 wherein:
the first projections each include an outermost surface positioned along a plane, and when the first memory module is attached to the first connector and the second memory module is attached to the second connector, an outermost surface of a majority of the second projections extends beyond the plane.

3. The memory system of claim 1 wherein:
a majority of the second projections are positioned between the neighboring first projections in a first direction, and
a majority of the second projections are aligned with corresponding first projections in a second direction different than the first direction.

4. The memory system of claim 1 wherein the first heat spreader includes a continuous outermost surface.

5. The memory system of claim 4 wherein the first projections increase an amount of exposed surface area of the continuous outermost surface compared to a planar surface.

6. The memory system of claim 1 wherein, when the first memory module is attached to the first connector and the second memory module is attached to the second connector, a plurality of air channels are formed between the first and second memory modules, and wherein the air channels are configured to receive a forced air flow from a fan disposed at an end of the memory system.

7. The memory system of claim 1 wherein the first and second memory modules are DDR5 DRAM memory modules.

8. The memory system of claim 1 wherein:
the first memory module includes a first substrate attached to the first semiconductor device(s) via a first plurality of electrical connectors; and
the second memory module includes a second substrate attached to the second semiconductor device(s) via a second plurality of electrical connectors,
wherein the distance from a centerline of the first substrate to a centerline of the second substrate is less than 8 millimeters.

9. The memory system of claim 8 wherein upper edges of two or more of the first substrate, the second substrate, the first heat spreader and the second heat spreader are generally coplanar, the memory system further comprising:
a third heat spreader disposed over the upper edges of the first substrate, the second substrate, the first heat spreader and the second heat spreader, wherein the third heat spreader is in thermal communication with each of the first substrate, the second substrate, the first heat spreader and the second heat spreader.

10. A memory module, comprising:
a substrate having a first side and a second side;
a first semiconductor device attached to the first side of the substrate;
a second semiconductor device attached to the second side of the substrate;
a first heat spreader attached to the first semiconductor device and facing a first direction, the first heat spreader including a plurality of first projections spaced apart from one another; and
a second heat spreader attached to the second semiconductor device and facing a second direction different than the first direction, the second heat spreader including a plurality of second projections spaced apart from one another,
wherein—
the plurality of first projections are positioned in a first arrangement,
the plurality of second projections are positioned in a second arrangement that is offset in at least one direction relative to the first arrangement, and
each projection in the plurality of first projections and/or the plurality of second projections has a side-view shape other than a rectangle or the side-view shape includes an air channel therein.

11. The memory module of claim 10 wherein edges of the first and second heat spreaders are generally aligned along a plane, and wherein an outermost row of the first projections are spaced apart from the plane by a first distance, and an outermost row of the second projections are spaced apart from the plane by a second distance different than the first distance.

12. The memory module of claim 10 wherein:
neighboring first projections are spaced apart from one another by a first distance in a horizontal direction and a second distance in a vertical direction, and
neighboring second projections are spaced apart from one another by the first distance in the horizontal direction and the second distance in the vertical direction.

13. The memory module of claim 12 wherein the first distance is greater than the second distance.

14. The memory module of claim 10, further comprising a thermally conductive adhesive disposed on the first semiconductor device and configured to attach the first heat spreader to the first semiconductor device.

15. The memory module of claim 10 wherein the first and second heat spreaders comprise a thermally conductive body including copper, aluminum, or a combination thereof.

16. The memory module of claim 10 wherein the substrate includes an end portion configured to be connected to a connector of a computing device.

17. The memory module of claim 10 wherein the first heat spreader includes edge extending beyond an outer edge of the first semiconductor device.

18. The memory module of claim 10 wherein each of the first projections include sidewalls and an outermost surface perpendicular to and extending between the sidewalls, wherein the outermost surface is separated from a base surface of the first heat spreader by the sidewalls.

19. The memory module of claim 10 wherein the first and second heat spreaders include a continuous outermost surface.

20. A method of manufacturing a memory module, the method comprising:
attaching one or more first semiconductor device(s) to a first side of a substrate;
disposing a first heat spreader on the first semiconductor device(s), the first heat spreader having a plurality of first projections positioned in a first arrangement;
attaching one or more second semiconductor device(s) to a second side of the substrate, the second side being opposite the first side; and
disposing a second heat spreader on the second semiconductor device(s), the second heat spreader having a plurality of second projections positioned in a second arrangement that is offset in at least one direction relative to the first arrangement;
wherein each projection in the plurality of first projections and/or the plurality of second projections has a side-view shape other than a rectangle or the side-view shape includes an air channel therein.

21. The method of claim 20 wherein a majority of the first projections are generally aligned with the second projections in a first direction and generally offset with the second projections in a second direction different than the first direction.

22. The memory system of claim 1 wherein the first and/or the second projections each have a shape having an outermost surface with greater surface area than an inner portion thereof.

23. The memory system of claim 1 wherein:
the first heat spreader is a first instance of a heat spreader having a first arrangement for the plurality of first projections;
the second heat spreader is a first instance of a heat spreader having a second arrangement for the plurality of second projections;
further comprising:
a third heat spreader configured to be attached to semiconductor device(s) on the first memory module, wherein the third heat spreader is attached opposite the first heat spreader and includes a plurality of projections arranged according to the first arrangement; and
a fourth heat spreader configured to be attached to semiconductor device(s) on the second memory module, wherein the fourth heat spreader is attached opposite the second heat spreader and includes a plurality of projections arranged according to the second arrangement.

* * * * *